United States Patent
Son et al.

(10) Patent No.: US 9,716,111 B2
(45) Date of Patent: Jul. 25, 2017

(54) DISPLAY DEVICE

(71) Applicant: Samsung Display Co., Ltd., Yongin, Gyeonggi-Do (KR)

(72) Inventors: Sunkwun Son, Gunpo-si (KR); Ju Hee Lee, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 93 days.

(21) Appl. No.: 14/458,450

(22) Filed: Aug. 13, 2014

(65) Prior Publication Data
US 2015/0255022 A1 Sep. 10, 2015

(30) Foreign Application Priority Data
Mar. 7, 2014 (KR) .................. 10-2014-0027258

(51) Int. Cl.
G02F 1/1345 (2006.01)
H01L 27/12 (2006.01)
G02F 1/1362 (2006.01)
G02F 1/1343 (2006.01)
H01L 27/02 (2006.01)

(52) U.S. Cl.
CPC ........ *H01L 27/124* (2013.01); *G02F 1/13452* (2013.01); *G02F 1/136204* (2013.01); *G02F 1/134363* (2013.01); *H01L 27/0288* (2013.01)

(58) Field of Classification Search
CPC ..... G09G 3/36; H01L 27/124; H01L 27/0288; G02F 1/134363; G02F 1/13452; G02F 1/136204
USPC .................................. 349/149–152
See application file for complete search history.

(56) References Cited

U.S. PATENT DOCUMENTS

| | | | | |
|---|---|---|---|---|
| 5,361,150 A | * | 11/1994 | Noguchi | G02F 1/1309 349/139 |
| 6,650,394 B1 | * | 11/2003 | Kim | G02F 1/1333 349/158 |
| 6,667,792 B2 | * | 12/2003 | Park | G02F 1/1333 349/158 |
| 6,734,931 B2 | * | 5/2004 | Yu | G02F 1/133514 349/106 |
| 8,749,747 B2 | * | 6/2014 | Yamazaki | G02F 1/1333 257/797 |
| 2001/0022637 A1 | | 9/2001 | Yu | |
| 2008/0158493 A1 | | 7/2008 | Park | |
| 2011/0089423 A1 | * | 4/2011 | Kwon | H01L 23/544 257/59 |
| 2013/0093658 A1 | * | 4/2013 | Park | G02F 1/13452 345/92 |

(Continued)

FOREIGN PATENT DOCUMENTS

| KR | 1020040058840 A | 7/2004 |
|---|---|---|
| KR | 10-0671679 B1 | 1/2007 |
| KR | 1020070114879 A | 12/2007 |

*Primary Examiner* — Charles Chang
(74) *Attorney, Agent, or Firm* — Cantor Colburn LLP (57) ABSTRACT

A display device includes a display panel which is configured to display an image, and includes a cell identification section configured to indicate an identification number of the display panel, and a pad section at least partly disposed on the cell identification section and being at least partly overlaid with the cell identification section, a printed circuit board configured to drive the display panel, and a chip-on-glass package electrically configured to connect the display panel with the printed circuit board.

19 Claims, 6 Drawing Sheets

(56) References Cited

U.S. PATENT DOCUMENTS

2013/0229591 A1 9/2013 Kong
2014/0240300 A1* 8/2014 Katsuta ............... G09G 3/3614
                                                            345/204

* cited by examiner

FIG. 7

DISPLAY DEVICE

This application claims priority to Korean Patent Application No. 10-2014-0027258, filed on Mar. 7, 2014, and all the benefits accruing therefrom under 35 U.S.C. §119, the entire contents of which are hereby incorporated by reference.

BACKGROUND

1. Field

Exemplary embodiments of the invention described herein relate to a display device, and more particularly, relate to a display device capable of reducing a spatial room for integration.

2. Description of the Related Art

Liquid crystal display ("LCD") device is one of flat-type display devices, most widely generalized in various apparatuses. The LCD device is generally configured to include two substrates, and a liquid layer interposed between the substrates, in which images are displayed by controlling intensity of light transmitted through the liquid crystal layer that is re-aligned in accordance with an electric field applied thereto.

Recently, due to problems arising from LCD devices operating with vertical electric fields, development for devices operating in horizontal electric fields has been researched. As an example, a study about plane-to-line switching ("LS") technology which is a horizontal electric field mode has been conducted.

SUMMARY

A horizontal electric field liquid crystal display ("LCD") device has limited space for integration, as compared to the vertical electric field LCD device because pixel and common electrodes are placed under a bottom substrate. Furthermore, since the horizontal electric field LCD device is not equipped with any electrode on a top substrate thereof, different from the vertical electric field LCD device, discharging external static electricity may be difficult. Eventually, even weak external static electricity may damage the device, causing inadvertently changing molecular alignment of liquid crystals to result in pictorial distortion.

For the above-mentioned reasons, many efforts about LCD devices are importantly focusing on securing a room for integration and intercepting generation of static electricity.

One exemplary embodiment of the invention is directed to provide a display device capable of reducing a spatial room for integration and effectively preventing static electricity.

In an exemplary embodiment, a display device may include a display panel configured to display an image, a printed circuit board ("PCB") configured to drive the display panel, and a chip-on-glass ("COG") package electrically configured to connect the display panel with the PCB. The display panel may include a cell identification ("ID") section configured to indicate an ID number of the display panel, and a pad section at least partly disposed on the cell ID section and at least partly overlaid with the cell ID section.

The display device may further include a driving section configured to supply a drive signal to the display panel, and a plurality of connection lines connected to the driving section. The plurality of connection lines may be at least partly connected to the pad section, transferring a ground signal to the pad section.

In an exemplary embodiment, in a plan view, the pad section at least partly may be overlaid with the cell ID section.

In an exemplary embodiment, the cell ID section may be physically isolated from the COG package.

In an exemplary embodiment, the cell ID section may be provided in plurality.

In an exemplary embodiment, the cell ID section may include more than one selected from a group including nickel, chrome, molybdenum, aluminum, titanium, copper, tungsten, and an alloy of them.

In an exemplary embodiment, the pad section may be configured in plurality.

In an exemplary embodiment, the pad section may include a conductive material.

In an exemplary embodiment, the pad section may include more than one selected from a group including nickel, chrome, molybdenum, aluminum, titanium, copper, tungsten, or alloys thereof.

In an exemplary embodiment, the display panel may further include a display area in which the image is expressed, and a non-display area in which the image is not displayed. The cell ID section and the pad section may be disposed in the non-display area.

In an exemplary embodiment, the display device may further include a touch screen panel on the display panel.

In an exemplary embodiment, the display panel may further include a first substrate including the cell ID section and the pad section, a second substrate opposite to the first substrate, and a liquid crystal layer interposed between the first and second substrates.

In an exemplary embodiment, the first substrate may include a first base substrate, a gate electrode disposed on the first base substrate, a semiconductor pattern overlaid with the gate electrode, a source electrode which contacts a part of the semiconductor pattern, a drain electrode which contacts with a remaining part of the semiconductor pattern and is physically isolated from the source electrode, a pixel electrode connected with the drain electrode, and a common electrode at least partly overlying the pixel electrode.

In an exemplary embodiment, the second substrate may include a second base substrate, a black matrix disposed on the second base substrate, a color filter which is disposed on the second base substrate, and configured to express colors of the image, and a conductive layer disposed on the black matrix and the color filter, and at least partly overlaid with the pad section.

In an exemplary embodiment, the pad section may be configured to transfer a ground signal to the conductive layer.

In an exemplary embodiment, the gate electrode may include a first gate electrode layer, and a second gate electrode layer on the first gate electrode layer. The cell ID section may be provided in the same layer with the first gate electrode layer, and the pad section may be provided in the same layer with the second gate electrode layer.

In an exemplary embodiment, the display device may further include an alignment mark provided on the first base substrate.

In an exemplary embodiment, the alignment mark may be physically isolated from the cell ID section and the pad section, respectively.

In the illustrated exemplary embodiment, the shortest one among intervals between the alignment mark and the cell ID section, and intervals between the alignment mark and the pad section, may be about 180 micrometers (μm) to about 220 μm.

BRIEF DESCRIPTION OF THE FIGURES

The above and other objects and features will become apparent from the following description with reference to the following figures, in which like reference numerals refer to like parts throughout the various figures unless otherwise specified, and in which.

DETAILED DESCRIPTION

Embodiments will be described in detail with reference to the accompanying drawings. The invention, however, may be embodied in various different forms, and should not be construed as being limited only to the illustrated embodiments. Rather, these embodiments are provided as examples so that this invention will be thorough and complete, and will fully convey the concept of the invention to those skilled in the art. Accordingly, known processes, elements, and techniques are not described with respect to some of the exemplary embodiments of the invention. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. In an exemplary embodiment, when the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. As used herein, isolated or connected may indicate physically and/or electrically isolated or connected.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the specification and will not be interpreted in an idealized or overly formal sense unless expressly so defined herein.

Now hereinafter will be described display devices according to exemplary embodiments of the invention in conjunction with accompanying drawings.

Figure 1:
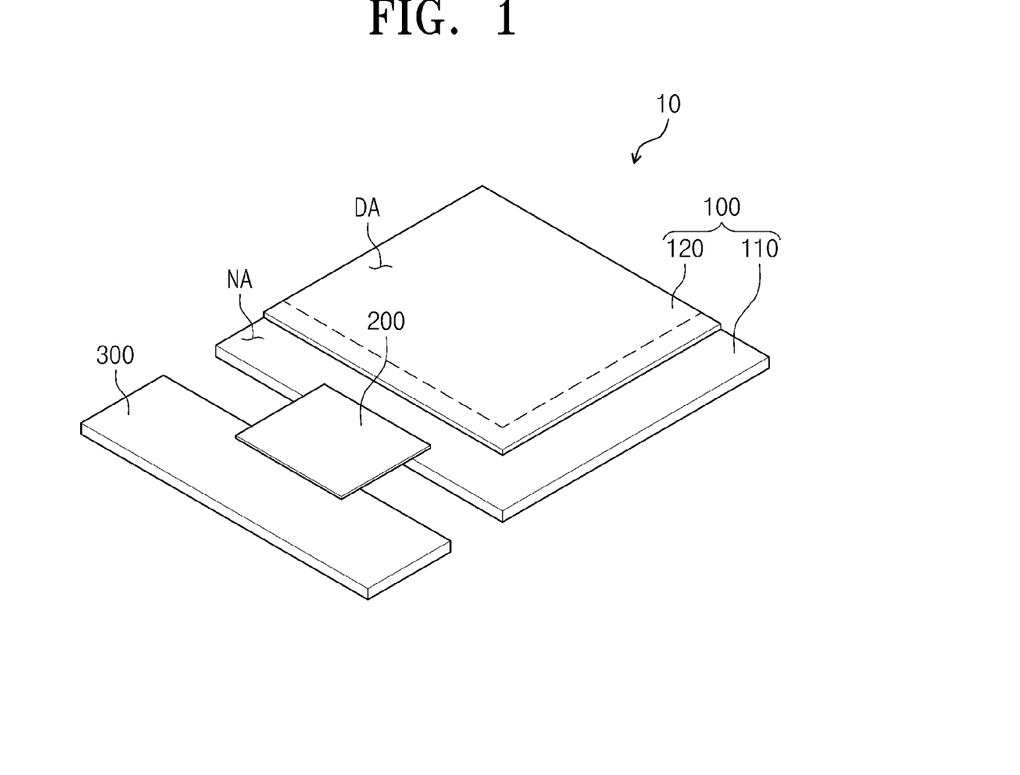
FIG. 1 is a perspective view schematically illustrating an exemplary embodiment of a display device according to the invention.

FIG. 1 is a perspective view schematically illustrating a display device according to an exemplary embodiment of the invention.

Referring to FIG. 1, the display device 10 includes display panel 100, a printed circuit board ("PCB") 300, and a Chip-On-Glass ("COG") package 200.

The display panel 100 may include various types such as an organic light emission display panel, an electrophoretic display panel, an electrowetting display panel, and so on, but hereinafter will be exemplified with a liquid crystal display ("LCD") panel.

Figure 2:
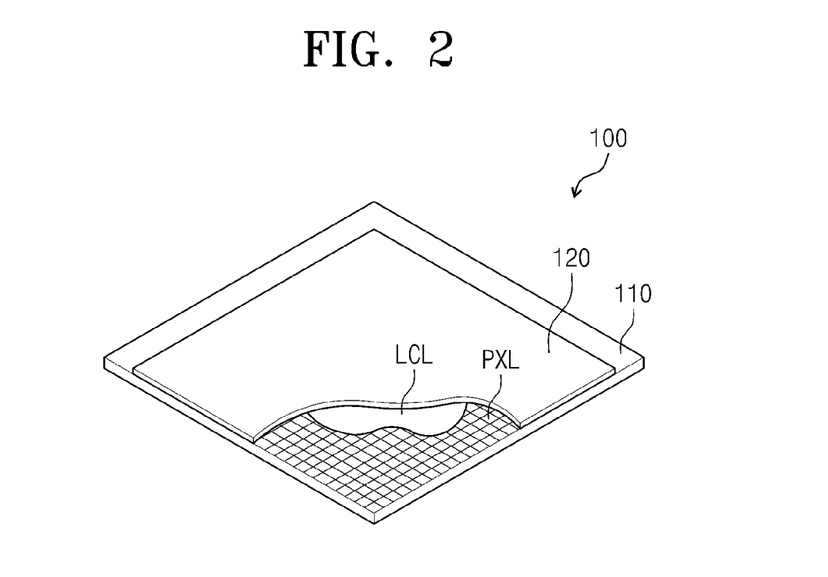
FIG. 2 is a perspective view schematically illustrating an exemplary embodiment of a display panel included in a display device according to the invention.

FIG. 2 is a perspective view schematically illustrating a display panel included in the display device according to an exemplary embodiment of the invention.

Figure 3:
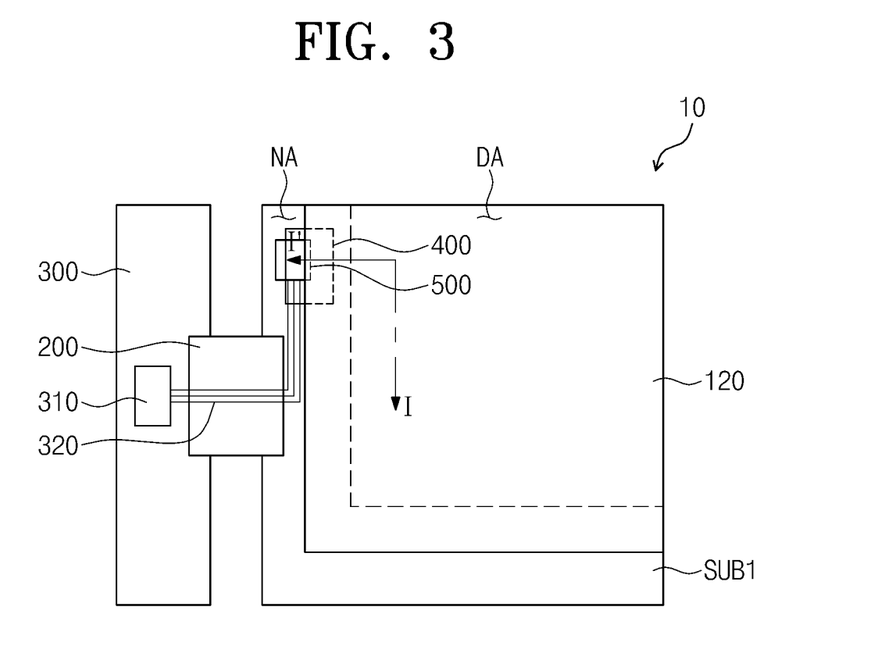
FIG. 3 is a perspective view schematically illustrating an exemplary embodiment of a part of a display device according to the invention.

FIG. 3 is a perspective view schematically illustrating a part of the display device according to an exemplary embodiment of the invention.

Figure 4:
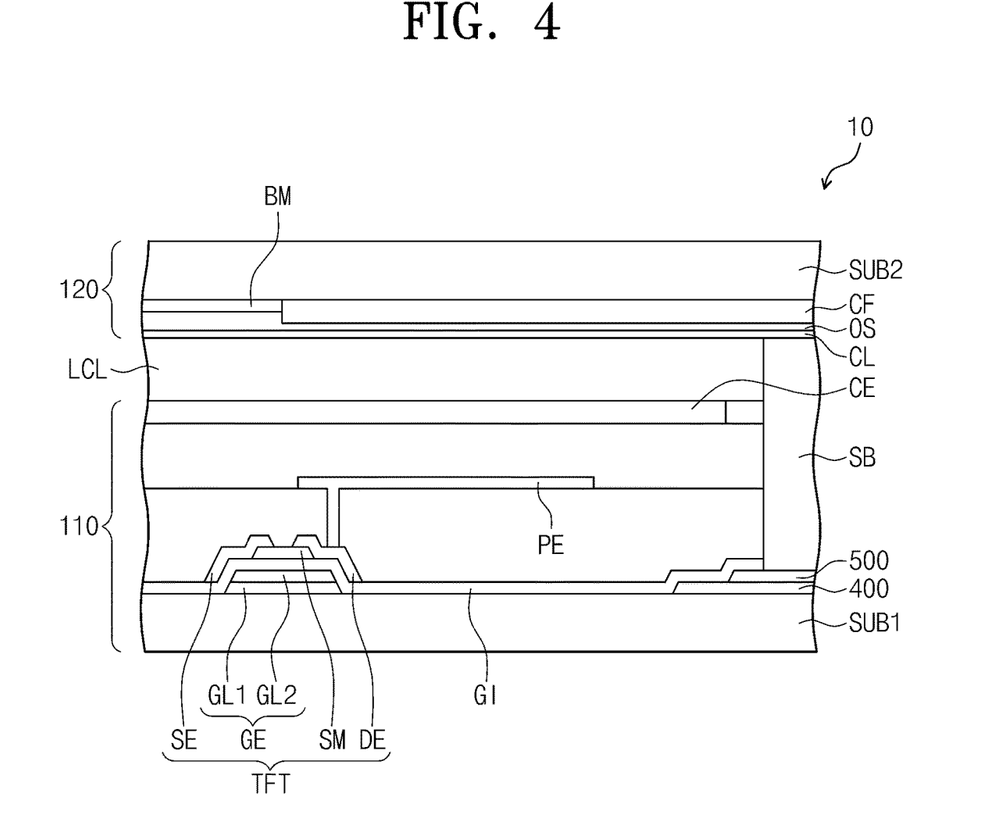
FIG. 4 is a sectional view taken along line I-I' of FIG. 3.

FIG. 4 is a sectional view taken along line I-I' of FIG. 3.

Referring to FIGS. 1 through 4, the display panel 100 displays an image. The display panel 100 includes a first substrate 110, a second substrate 120 opposite to the first substrate 110, and a liquid crystal layer LCL interposed between the first substrate 110 and the second substrate 120.

The display panel 100 includes a display area DA in which an image is displayed, and a non-display area NA in which an image is not displayed. The non-display area NA may include at least a part of a region in which the first substrate 110 is overlaid with the second substrate 120, and a region in which the first substrate 110 is not overlaid with the second substrate 120. The display area DA may include a remaining part of the region overlaid with the second substrate 120.

Additionally, the display panel 100 includes a cell identification ("ID") section 400 and a pad section 500. The cell ID section 400 and the pad section 500 will be detailed later.

The first substrate 110 includes a plurality of pixels PXL. Each pixel of the first substrate 110 includes at least one thin film transistor TFT, a pixel electrode PE, and a common electrode CE, which are used together to actuate liquid crystal molecules.

The first substrate 110 includes a first base substrate SUB1, the thin film transistor TFT, the pixel electrode PE, and the common electrode CE.

In an exemplary embodiment, the first base substrate SUB1 may include plastic, glass, or quartz, for example. In an exemplary embodiment, the first base substrate SUB1 may be a transparent insulation substrate.

A gate line (nor shown) and a data line (not shown) may be disposed on the first base substrate SUB1. The gate line (nor shown) is configured to extend along a first direction. The data line (nor shown) is configured to extend along a second direction intersecting the first direction, interposing the gate insulation film GI between the gate line and the data line.

The thin film transistor TFT includes a gate electrode GE, a semiconductor pattern SM, a source electrode SE, and a drain electrode DE.

The gate electrode GE is protruded from the gate line (not shown) or provided on a part of the gate line (not shown). In an exemplary embodiment, the gate electrode GE may include nickel, molybdenum, aluminum, titanium, copper, tungsten, or an alloy including any combinations of the above-mentioned elements.

The gate electrode GE may include a first gate electrode layer GL1 and a gate electrode layer GL2. The second gate electrode layer GL2 is disposed on the first gate electrode layer GL1. While the display device 10 includes the gate electrode GE including double layers in the illustrated exemplary embodiment of the invention, the invention is not limited thereto, and the gate electrode GE may be a single layer or a multiple layer including more layers than double levels. In an exemplary embodiment, the gate electrode GE may be a double layer in which titanium and copper are sequentially stacked, or a triple layer in which molybdenum, aluminum and then molybdenum are sequentially stacked, for example. Otherwise, in another exemplary embodiment, the gate electrode GE may be a single layer including an alloy with titanium and copper, for example.

The first gate electrode layer GL1 may include at least one of nickel, chrome, molybdenum, aluminum, titanium, copper, tungsten, and an alloy including any combinations of the above-mentioned elements. The second gate electrode layer GL2 may also include at least one of nickel, chrome, molybdenum, aluminum, titanium, copper, tungsten, and an alloy including any combinations of the above-mentioned elements. The first and second gate electrode layers, GL1 and GL2, may include the same material with each other or different materials from each other.

A gate insulation film GI is disposed on the gate electrode GE. The gate insulation film GI is disposed on an upper surface of the first base substrate SUB1, covering the gate line electrode GE.

The semiconductor pattern SM is placed on the gate insulation film GI. The semiconductor pattern SM is placed on the gate electrode GE while interposing the gate insulation film GI therebetween, being partly overlaid with the gate electrode GE.

The source electrode SE is branched out from the data line electrode layer. The source electrode SE partly overlays the gate electrode GE.

The drain electrode DE is physically isolated from the source electrode SE, interposing the semiconductor pattern SM therebetween. The drain electrode DE is configured to partly overlay the gate electrode GE.

In an exemplary embodiment, the source electrode SE and the drain electrode DE may include nickel, chrome, molybdenum, aluminum, titanium, copper, tungsten, and an alloy including any combinations of the above-described elements.

The pixel electrode PE is connected to the drain electrode DE. In an exemplary embodiment, the pixel electrode PE includes a transparent conductive material. In an exemplary embodiment, the pixel electrode PE includes a transparent conductive oxide, for example. In an exemplary embodiment, the transparent conductive oxide includes Indium Tin Oxide ("ITO"), Indium Zinc Oxide ("IZO"), Indium Tin Zinc Oxide ("ITZO"), and so on. In exemplary embodiments, the pixel electrode PE may be provided in various ways, e.g., a photolithography process.

The common electrode CE is disposed on the pixel electrode PE. By providing the pixel electrode PE and generating an electric field, the liquid crystal layer LCL is actuated. In an exemplary embodiment, the common electrode CE may include a transparent conductive material, for example. In an exemplary embodiment, the common electrode CE includes a conductive metal oxide such as ITO, IZO, ITZO, and so on. In an exemplary embodiment, the common electrode CE may be provided in various ways, e.g., a photolithography process.

The second substrate 120 includes a second base substrate SUB2, a black matrix BM, a color filter CF, and a conductive layer CL. Although the black matrix BM and the color filter CF are included in the second substrate 120 of the display device 10 according to the illustrated exemplary embodiment of the invention, the invention is not limited thereto, and the black matrix BM and the color filter CF may be included in the first substrate 110.

In an exemplary embodiment, the second base substrate SUB2 may include plastic, glass, quartz, or so on. In an exemplary embodiment, the second base substrate SUB2 may be a transparent insulation substrate, for example.

The black matrix BM is provided in correspondence with a shading region of the first substrate 110. In an exemplary embodiment, the shading region may be defined as an area in which the data line (not shown), the thin film transistor TFT and the gate line (not shown) are provided. Since it is general not to provide the pixel electrode PE in the shading region, the liquid crystal molecules cannot be aligned to generate a light source. Therefore, the black matrix BM is provided in the shading region to block light. In exemplary embodiments, the black matrix BM may be provided before, after or during an operation of providing the color step CF. In an exemplary embodiment, the black matrix BM may be provided by depositing a shading layer and the patterning the shading layer through photolithography. However, the invention is not limited thereto, and the black matrix BM may be provided by another way such as an inkjet technique, for example, in an alternative exemplary embodiment.

The color filter CF is disposed on the second base substrate SUB2, providing colors for light transmitted through the liquid crystal layer LCL. In an exemplary embodiment, a color layer in the color filter CF may be provided to indicate red, green, blue or another color and then patterned by photolithography, for example. However, the method of providing color filter CF may not be restrictive hereto, and may be also permissible by way of an inkjet technique, for example.

A planarization layer OS may be disposed on the black matrix BM and the color filter CF. The planarization layer OS may flatten the second substrate 120.

The conductive layer CL is disposed on the black matrix BM and the color filter CF. The conductive layer CL may be disposed on the planarization layer OS. Although the conductive layer CL is disposed on a whole portion of the second base substrate SUB2 in the illustrated exemplary embodiment of the invention, the invention is not limited thereto, and the conductive layer CL may be provided only on a part of the second base substrate SUB2.

The conductive layer CL may include an electrically conductive material. A material of the conductive layer CL may not be specifically restrictive to generally used ones, e.g. a metal or a carbonic material. The conductive layer CL may at least partly overlay the pad section 500.

The pad section 500 and the conductive layer CL may be connected through a shorting bar SB. The pad section 500 may transfer a ground signal to the conductive layer CL through the shorting bar SB, thereby effectively discharge external static electricity that is induced into the second substrate 120.

In an exemplary embodiment, the liquid crystal layer LCL includes a multiplicity of liquid crystal molecules having dielectric anisotropy. The liquid crystal molecules of the liquid crystal layer LCL turn to be aligned with a predetermined orientation when an electric field is applied between the common electrode CE and the pixel electrode PE of the first substrate 110, thereby adjusting transmittance of light incident on the liquid crystal layer LCL.

The display device 10 according to an exemplary embodiment of the invention includes the PCB 300 and the COG package 200.

The PCB 300 drives the display panel 100. The PCB 300 may include a driving section 310 for supplying drive signals to the display panel 100. Although the PCB 300 includes the driving section 310 in the illustrated exemplary embodiment, the invention is not limited thereto, and the driving section may be included in the COG package 200.

The driving section 310 generates the drive signals, for activating the display panel 100, in response to external signals. The external signals are supplied from the PCB 300. In exemplary embodiments, the external signals may include image signals, diverse control signals, drive voltages, and so forth.

The display panel 100 may receive gate and data signals for expressing images, and the driving section 310 may include data drivers (not shown) for converting the image signals into the drive signals and then transferring the drive signals to the display panel 100. However, the invention is not limited thereto, and the data drivers (not shown) may be built in the COG package 200 in a form of a chip, or set on the first base substrate SUB1.

Gate drivers (not shown) generating the gate signals may be directly settled on the first base substrate SUB1. However, the invention is not limited thereto, and the gate drivers (not shown) may be built in the COG package 200 or the driving section 310 in a form of chip.

The PCB 300 may be electrically connected to the display panel 100 by the COG package 200. While the COG package 200 is provided with one member in the illustrated exemplary embodiment of the invention, the invention is not limited thereto, and it may be permissible to configure the COG package 200 in plurality.

As stated above, the display device 10 according to an exemplary embodiment of the invention includes the display panel 100, and the display panel 100 includes the cell ID section 400 and the pad section 500.

The cell ID section 400 indicates an ID number for the display panel 100. The cell ID section may express an ID number to show historical information of the display panel 100. In other words, the cell ID section 400 is used as a guide easily notifying historical information about the display panel 100 from manufacturing and commercialization thereof.

The cell ID section 400 may not be restrictive to a specific configuration as far as it is capable of indicating an ID number of the display panel 100. In an exemplary embodiment, the cell ID section 400 may be shaped in a circle, an ellipse, a triangle, a tetragon, or a pentagon, for example. In the display device 10 according to the illustrated exemplary embodiment of the invention will be described as the cell ID section 400 is provided in a shape of tetragon as an example.

In an exemplary embodiment, the cell ID section 400 may be provided in plurality. It may be necessarily configurable for a plurality of the cell ID sections 400 to transfer different historical information of the display panel 100 from each other.

The cell ID section 400 is not restrictive to a specific type as long as it is a generalized one, but may be allowable to include at least one of nickel, chrome, molybdenum, aluminum, titanium, copper, tungsten, and an alloy including any combinations of the above-described elements.

In an exemplary embodiment, the cell ID section 400 may be provided in the same layer with the first gate electrode layer GL1. The cell ID section 400 may be provided together with the first gate electrode layer GL1 in the same processing operation.

In an exemplary embodiment, the cell ID section 400 may be provided in the non-display area NA where an image is not expressed. Providing the cell ID section 400 in the non-display area NA may not prevent an image from appearing at the display panel 100.

The pad section 500 is at least partly disposed on the cell ID section 400. A remaining portion of the pad section 500 may be disposed on the first base substrate SUB1. Although not shown, the pad section 500 is provided to be physically isolated from the gate line (not shown) and the data line (not shown).

The pad section 500 is connected to at least a part of a plurality of connection lines 320 coupled with the driving section 310. In other words, the pad section 500 may be connected to a part or all of a plurality of the connection lines 320.

The pad section 500 is not restrictive in embodiments for configuration. In another exemplary embodiment, the pad section 500 may be configured in a circle, an ellipse, a triangle, a tetragon, or another polygon, for example. The display device 10 according to the illustrated exemplary embodiment of the invention has a shape of tetragon, for example.

In an exemplary embodiment, the pad section 500 may be disposed in the same layer with the second gate electrode layer GL2. In an exemplary embodiment, the pad section 500 may be provided along with the second gate electrode layer GL2 during the same processing operation.

In an exemplary embodiment, the pad section 500 may include a conductive material. The pad section 500 is not limited to a generally used conductive material, but may include at least one of nickel, chrome, molybdenum, aluminum, titanium, copper, tungsten, and an alloy including any combinations of the above-described elements.

As stated above, the pad section 500 may transfer a ground signal to the conductive layer CL. In an exemplary embodiment, the pad section 500 may be connected to the conductive layer CL, thereby capable of transferring the ground signal to the conductive layer CL, by way of the shorting bar SB. It can be ordinarily understood that, when there is no electrode throughout the second substrate 120, it is impossible to discharge external static electricity induced into the second substrate 120. Eventually, even weak external static electricity may damage to cause crystal molecules to change their alignment orientation, resulting in image distortion.

The display device 10 according to embodiments of the invention is able to effectively discharge external static electricity, which is induced into the second substrate 120, by transferring the ground signal to the conductive layer CL through the shorting bar SB.

Figure 5A:
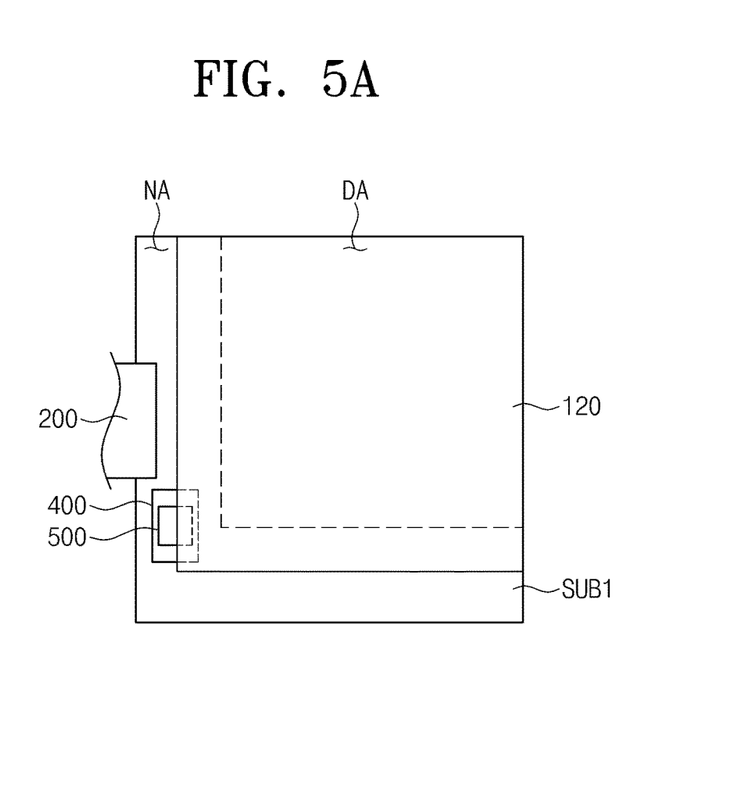
FIGS. 5A, 5B and 5C are plan views schematically illustrating an exemplary embodiment of various patterns of cell ID and pad sections included in a display device according to the invention.
Figure 5B:
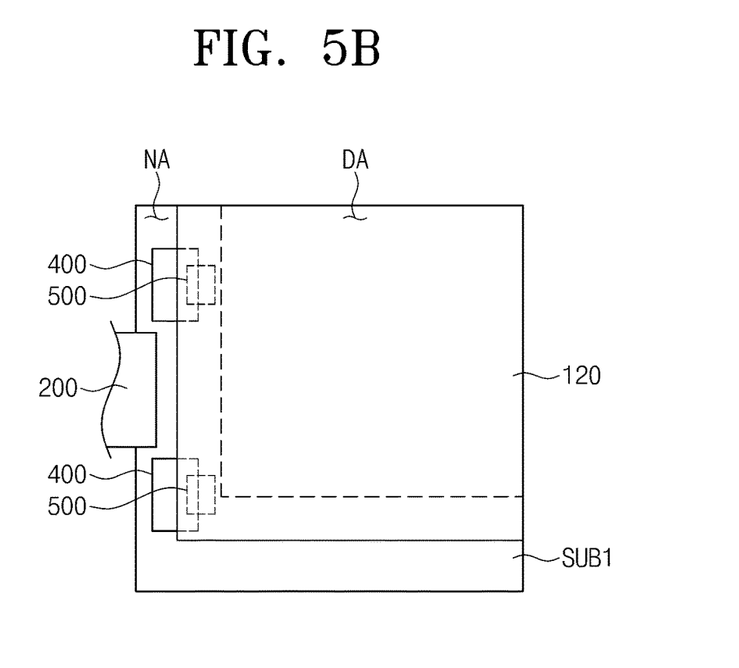
Figure 5C:
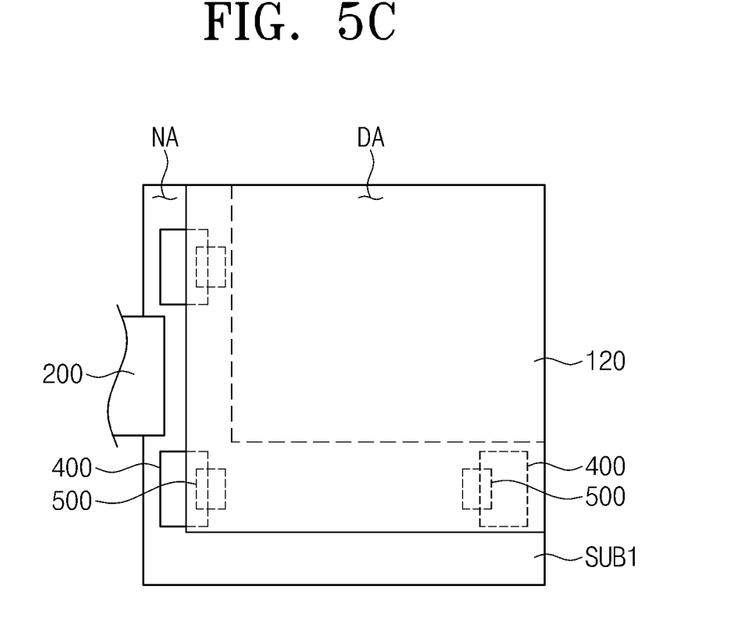

FIGS. 5A, 5B and 5C are plan views schematically illustrating various patterns of the cell ID section 400 and the pad section 500 included in the display device 10 according to an exemplary embodiment of the invention.

Referring to FIGS. 3 and 5A, the cell ID section 400 and the pad section 500 may be placed at various positions on the first base substrate SUB1. Additionally, each of the cell ID section 400 and the pad section 500 may be provided in plurality. Referring to FIG. 5B, for example, two pairs of the cell ID section 400 and the pad section 500 may be provided. In another exemplary embodiment, three pairs of the cell ID section 400 and the pad section 500 may be provided, as shown in FIG. 5C.

Referring to FIGS. 1 through 5C, the pad section 500 may partly overlay the cell ID section 400 in a plan view.

A whole of the pad section 500 may overlay the cell ID section 400. In an exemplary embodiment, in a plan view with reference to FIG. 5A, a whole of the pad section 500 may overlay the cell ID section 400. In an exemplary embodiment, at least one side of the pad section 500 may match with at least a side of the cell ID section 400 in a plan view, for example.

The pad section 500 may partly overlay the cell ID section 400. In an exemplary embodiment, in a plan view with reference to FIGS. 3, 5B and 5C, the pad section 500 may overlay at least a side of the cell ID section 400.

The display device 10 according to embodiments of the invention is capable of decreasing a space occupied by the pad section 500, which overlays the cell ID section 400, in the display panel 100, i.e. reducing room for integration. Therefore, the reduced space integration may be otherwise utilized to increase efficiency of the display panel 100.

Referring to FIGS. 1 through 5C, the pad section 500 may be provided in the non-display area NA where any image is not expressed. The pad section 500 may be provided in the non-display area NA, preventing an image from being shaded in the display panel 100.

Figure 6:
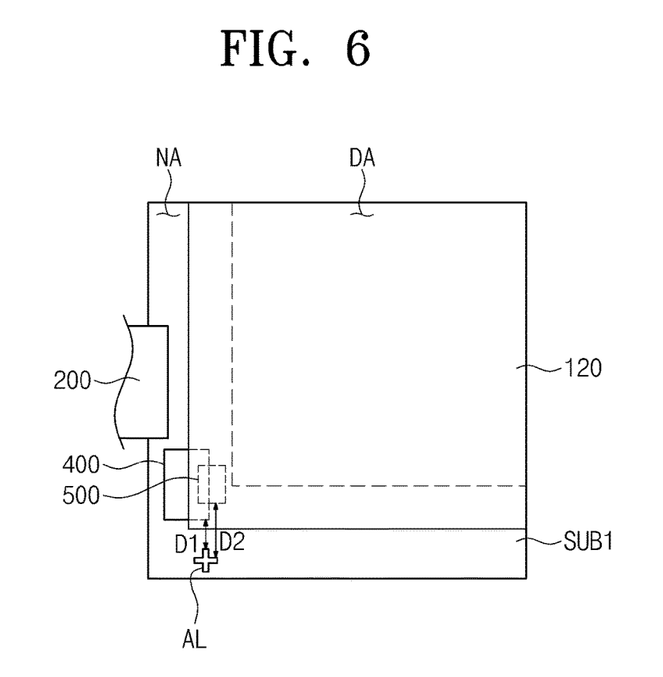
FIG. 6 is a plan view schematically illustrating an exemplary embodiment of a part of a display device according to the invention.

FIG. 6 is a plan view schematically illustrating a part of the display device 10 according to an exemplary embodiment of the invention.

Referring to FIGS. 1 through 6, the display device 10 may further include an alignment mark AL.

The alignment mark AL indicates positions in the fabrication process, helping to enhance processing efficiency. A pattern of the alignment mark AL is not restrictive to a specific one or a generally used one, but may be shaped in a polygon such as circle, triangle, tetragon, and so forth. In the illustrated exemplary embodiment of the invention, the display device 10 may include the alignment mark AL patterned in a cross, for example.

The alignment mark AL is provided on the first base substrate SUB1. The alignment mark AL may be physically isolated from the cell ID section 400 and the pad section 500.

Between the shortest distance (e.g. D1 of FIG. 6) among intervals between the alignment mark AL and the cell ID section 400 and the shortest distance (e.g. D2 of FIG. 6) among intervals between the alignment AL and the pad section 500, the smaller one may be about 180 micrometers (μm) to about 220 μm. In the illustrated exemplary embodiment, the shortest interval may refer to the shortest distance taken along a vertical direction in a plan view.

When the shortest interval is less than about 180 μm, such a short interval may generate a defect therein. When the shortest interval is greater than about 220 μm, such a long interval may further increase a size of a substrate. Eventually, the shortest interval greater than about 220 μm may result in a lesser number of the display devices fabricated out from the same substrate.

Figure 7:
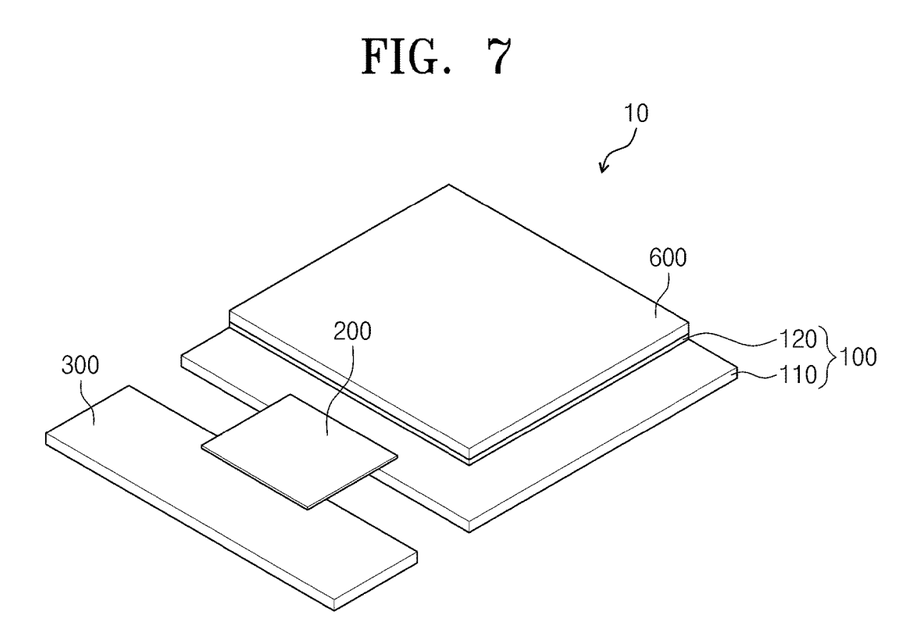
FIG. 7 is a perspective view illustrating an exemplary embodiment of a display device according to the invention.

FIG. 7 is a perspective view illustrating the display device 10 according to an exemplary embodiment of the invention.

Referring to FIG. 1 through 7, the display device 10 according to the illustrated exemplary embodiment of the invention may further include a touch screen panel 600.

The touch screen panel 600 is disposed on the display panel 100. The touch screen panel 600 may detect an input from a user. The touch screen panel 600 may be unitary with the display panel 100.

In the display device according to the illustrated exemplary embodiment of the invention, the pad section may transfer a ground signal to equalize the first and second substrates in voltage, hence effectively discharging external static electricity induced into the second substrate.

Additionally, the display device according to the illustrated exemplary embodiment of the invention is advantageous to reducing a space occupied by the pad section in the display panel, i.e. saving a room for integration, because the pad section is configured to at least partly overlay the cell ID section. The saved room in the display panel may be otherwise efficiently utilized therein for integration of other elements of the display device.

As described above, the display device according to embodiments of the invention is useful for reducing a spatial room for integration.

While the invention has been described with reference to exemplary embodiments, it will be apparent to those skilled in the art that various changes and modifications may be made without departing from the spirit and scope of the invention. Therefore, it should be understood that the above embodiments are not limiting, but illustrative.

What is claimed is:

1. A display device comprising:
a display panel which is configured to display an image, and comprises:
a cell identification section configured to indicate an identification number of the display panel; and
a pad section disposed directly on the cell identification section and at least partly overlaid with the cell identification section;
a printed circuit board configured to drive the display panel; and
a chip-on-glass package electrically configured to connect the display panel and the printed circuit board,
wherein
at least a portion of the cell identification section is exposed by the pad section in a plan view.

2. The display device according to claim 1, further comprising:
a driving section configured to supply a drive signal to the display panel; and
a plurality of connection lines connected to the driving section,
wherein the plurality of connection lines is at least partly connected with the pad section and configured to transfer a ground signal to the pad section.

3. The display device according to claim 1, wherein, in a plan view, the pad section at least partly overlays the cell identification section.

4. The display device according to claim 1, wherein the cell identification section is physically isolated from the chip-on-glass package.

5. The display device according to claim 1, wherein the cell identification section is provided in plurality.

6. The display device according to claim 1, wherein the cell identification section includes nickel, chrome, molybdenum, aluminum, titanium, copper, tungsten, or alloys thereof.

7. The display device according to claim 1, wherein the pad section is provided in plurality.

8. The display device according to claim 1, wherein the pad section includes a conductive material.

9. The display device according to claim 1, wherein the pad section includes nickel, chrome, molybdenum, aluminum, titanium, copper, tungsten, or alloys thereof.

10. The display device according to claim 1, wherein the display panel further comprises:
a display area in which the image is displayed; and
a non-display area in which the image is not displayed,
wherein the cell identification section and the pad section are disposed in the non-display area.

11. The display device according to claim 1, further comprising a touch screen panel on the display panel.

12. The display device according to claim 1, wherein the display panel further comprises:
a first substrate including the cell identification section and the pad section;
a second substrate opposite to the first substrate; and
a liquid crystal layer interposed between the first and second substrates.

13. The display device according to claim 12, wherein the first substrate comprises:
a first base substrate;
a gate electrode disposed on the first base substrate;
a semiconductor pattern overlaid with the gate electrode;
a source electrode which contacts a part of the semiconductor pattern;
a drain electrode which contacts another part of the semiconductor pattern and is physically isolated from the source electrode;
a pixel electrode connected with the drain electrode; and
a common electrode at least partly overlying the pixel electrode.

14. The display device according to claim 13, wherein the second substrate comprises:
a second base substrate;
a black matrix disposed on the second base substrate;
a color filter which is disposed on the second base substrate, and configured to display colors of the image; and
a conductive layer disposed on the black matrix and the color filter, and at least partly overlaid with the pad section.

15. The display device according to claim 14, wherein the pad section is configured to transfer a ground signal to the conductive layer.

16. The display device according to claim 14, wherein the gate electrode comprises:
a first gate electrode layer; and
a second gate electrode layer on the first gate electrode layer,
wherein the cell identification section is provided in the same layer with the first gate electrode layer,
wherein the pad section is provided in the same layer with the second gate electrode layer.

17. The display device according to claim 13, further comprising an alignment mark provided on the first base substrate.

18. The display device according to claim 17,
wherein the alignment mark is physically isolated from the cell identification section, and
wherein the alignment mark is physically isolated from the pad section.

19. The display device according to claim 18, wherein a shortest distance among intervals between the alignment mark and the cell identification section, and intervals between the alignment mark and the pad section, is about 180 micrometers to about 220 micrometers.

* * * * *